United States Patent
Sasage et al.

(10) Patent No.: US 11,104,832 B2
(45) Date of Patent: Aug. 31, 2021

(54) LIQUID EPOXY RESIN SEALING MATERIAL AND SEMICONDUCTOR DEVICE

(71) Applicant: NAMICS CORPORATION, Niigata (JP)

(72) Inventors: Nozomu Sasage, Niigata (JP); Yohei Hosono, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 16/478,155

(22) PCT Filed: Feb. 6, 2018

(86) PCT No.: PCT/JP2018/003977
§ 371 (c)(1),
(2) Date: Jul. 16, 2019

(87) PCT Pub. No.: WO2018/155165
PCT Pub. Date: Aug. 30, 2018

(65) Prior Publication Data
US 2019/0367788 A1    Dec. 5, 2019

(30) Foreign Application Priority Data

Feb. 21, 2017   (JP) .............................. JP2017-029912

(51) Int. Cl.
| | |
|---|---|
| *C09K 3/10* | (2006.01) |
| *C08L 63/00* | (2006.01) |
| *C09K 15/08* | (2006.01) |
| *H01L 21/56* | (2006.01) |
| *H01L 23/29* | (2006.01) |

(52) U.S. Cl.
CPC ................ *C09K 3/10* (2013.01); *C08L 63/00* (2013.01); *C09K 15/08* (2013.01); *H01L 21/563* (2013.01); *H01L 23/295* (2013.01); *C08L 2201/08* (2013.01); *C08L 2203/206* (2013.01); *C08L 2205/025* (2013.01); *C09K 2200/0647* (2013.01)

(58) Field of Classification Search
CPC .................................................... C09K 15/08
See application file for complete search history.

(56) References Cited

U.S. PATENT DOCUMENTS

| | | | |
|---|---|---|---|
| 9,024,455 B2 | 5/2015 | Honda | |
| 9,129,898 B2 | 9/2015 | Honda | |
| 2011/0251305 A1 | 10/2011 | Ueno et al. | |
| 2012/0010329 A1* | 1/2012 | Hunter | ................... C08L 63/00 |
| | | | 523/457 |

FOREIGN PATENT DOCUMENTS

| | | | |
|---|---|---|---|
| CN | 103709602 A | | 4/2014 |
| CN | 104629262 A | | 5/2015 |
| JP | H10130374 A | | 5/1998 |
| JP | 2006169395 A | | 6/2006 |
| JP | 2007197655 A | | 8/2007 |
| JP | 2009124126 A | | 6/2009 |
| JP | 2012041403 A | * | 3/2012 |
| JP | 2016113564 A | * | 6/2016 |
| JP | 2016113565 A | | 6/2016 |
| TW | 201139494 A | | 11/2011 |
| WO | 2011065365 A1 | | 6/2011 |

OTHER PUBLICATIONS

English machine translation of JP-2012041403-A.*
English machine translation of JP-2016113564-A.*
International Search Report dated Apr. 3, 2018 filed in PCT/JP2018/003977.
Taiwanese Office Action (TWOA) dated Jun. 15, 2021 for the corresponding Taiwanese Patent Application No. 107105135.

* cited by examiner

Primary Examiner — Michael F Pepitone
(74) Attorney, Agent, or Firm — Rankin, Hill & Clark LLP

(57) ABSTRACT

Provided are a liquid epoxy resin sealing material capable of suppressing occurrence of fillet cracks generated when an underfill cured product is left under high temperature aerobic conditions, and a semiconductor device using the liquid epoxy resin sealing material. More specifically, provided are the liquid epoxy resin sealing material containing (A) a liquid epoxy resin, (B) an amine curing agent, (C) an inorganic filler and (D) an antioxidant agent represented by the following formula, wherein 0.5 to 10 parts by mass of (D) the antioxidant agent is contained based on a total of 100 parts by mass of (A) the epoxy resin and (B) the amine curing agent, and the semiconductor device using the liquid epoxy resin sealing material.

5 Claims, No Drawings

LIQUID EPOXY RESIN SEALING MATERIAL AND SEMICONDUCTOR DEVICE

CROSS-REFERENCE TO RELATED APPLICATIONS

This application is a National Phase Application of International Application No. PCT/JP2018/003977, filed Feb. 6, 2018, which claims the priority of Japan Patent Application No. 2017-029912, filed Feb. 21, 2017. The present application claims priority from both applications and each of these applications is herein incorporated in their entirety by reference.

TECHNICAL FIELD

The present disclosure relates to a liquid epoxy resin sealing material and a semiconductor device.

BACKGROUND ART

With miniaturization, weight reduction, and high performance of electronic devices, a mounting form of semiconductors is changing from a wire bond type to a flip chip type.

A flip chip type semiconductor device has a structure in which an electrode portion on a substrate and a semiconductor element are connected via a bump electrode. When heat load such as a temperature cycle is applied to the semiconductor device of this structure, stress is applied to the bump electrode due to a difference between thermal expansion coefficients of the substrate made of an organic material such as an epoxy resin and the semiconductor element. Therefore, there is a problem that defects such as cracks occur in the bump electrode. In order to suppress occurrence of defects, it is widely practiced to seal a gap between the semiconductor element and the substrate using the semiconductor sealing material called an underfill. Thus, thermal cycle resistance can be improved by fixing the both to each other.

As a supply method of an underfill material, the semiconductor element and the electrode portion on the substrate are first connected. Thereafter, the underfill material is applied (dispensed) along an outer periphery of the semiconductor element. At this time, a method called capillary flow is widely used. According to this method, the underfill material is injected into the gap between the two by capillary action. By heat-curing the underfill material after injection of the underfill material, it is possible to reinforce a connection between the two.

The underfill material is required to have excellent properties such as injectability, adhesiveness, curability, and storage stability. In addition, excellent properties such as moisture resistance and thermal cycle resistance are also required for a portion sealed with the underfill material.

As a liquid sealing material used as the underfill in order to satisfy the above requirements, the liquid sealing material containing an epoxy resin as a main material is widely used.

In order to improve the moisture resistance and the thermal cycle resistance, particularly the thermal cycle resistance, of the portion sealed with the liquid sealing material, a filling material (hereinafter referred to as a "filler") made of an inorganic substance such as a silica filler is added to the liquid sealing material. Thus, it is known that the difference between the thermal expansion coefficients of the substrate made of an organic material such as an epoxy resin and the semiconductor element can be effectively controlled, and the bump electrode can be reinforced (see PATENT LITERATURE 1).

CITATION LIST

Patent Literature

PATENT LITERATURE 1: JP-A-10-130374

SUMMARY OF THE INVENTION

Problems to be Solved by the Invention

As described above, improvement of the thermal cycle resistance of the portion sealed with the liquid sealing material has been a problem. When the thermal cycle resistance is insufficient, there arises a problem that the cracks occur at an interface between the semiconductor element and the electrode portion on the substrate.

The present inventors have found that a unique fillet crack different from that in thermal cycle resistance test may be observed when cured underfill is left under high temperature aerobic conditions of 100° C. or higher even when the thermal cycle resistance is improved. The fillet crack proceeds in a thickness direction from a surface of the cured underfill. When such a crack occurs, there arises a problem that a function as the underfill is lost.

An object of the present disclosure is to provide the liquid epoxy resin sealing material for the underfill, which can suppress occurrence of the fillet cracks when the cured underfill is left under high temperature aerobic conditions, in order to solve the above problems in the related art.

Solution to the Problems

The fillet crack occurs under high temperature aerobic conditions. However, it does not occur under nitrogen even if maintained at the same temperature. Therefore, aerobic thermal degradation is presumed to be a cause of the fillet crack.

The present inventors attempted to add a hindered phenolic antioxidant in order to suppress the occurrence of the fillet crack due to the aerobic thermal degradation. Reasons for selecting the hindered phenolic antioxidant are as described below.

The hindered phenolic antioxidant is classified as a primary antioxidant. The hindered phenolic antioxidant acts directly on a radical generated by autoxidation to exhibit excellent antioxidant capability. Hindered amine antioxidants can also be used as the primary antioxidants. However, the hindered amine antioxidants have a coloring problem. On the other hand, phosphorus-based antioxidants and sulfur-based antioxidants, which are classified as secondary antioxidants, have peroxide degradability. This acts on peroxides converted from radicals by the primary antioxidants. Therefore, these antioxidants are often used in combination with the primary antioxidants.

In aerobic thermal degradation reaction, a radical chain reaction proceeds. In the chain reaction, a reactive peroxy radical ROO. is generated from a radical R. generated in an initial stage of the reaction. The hindered phenolic antioxidant has an action of scavenging the peroxy radical and converting it to metastable hydroperoxide ROOH as shown in the following formula.

[Chemical formula 1]

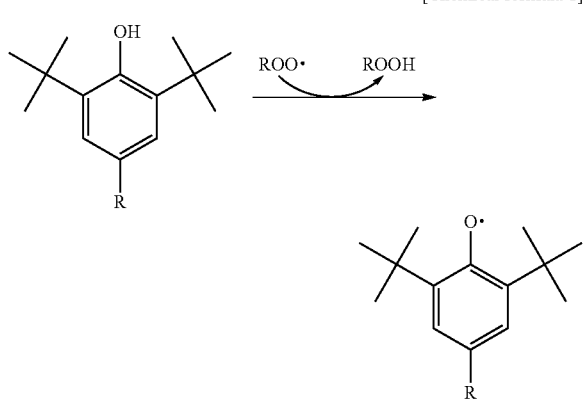

As a result of intensive studies, the present inventors found that it is necessary to add the hindered phenolic antioxidant having a specific structure, in order to suppress the occurrence of the fillet crack due to the aerobic thermal degradation.

The liquid epoxy resin sealing material of the present disclosure has been achieved based on the above findings. According to the present disclosure, there is provided the liquid epoxy resin sealing material containing (A) a liquid epoxy resin, (B) an amine curing agent, (C) an inorganic filler, and (D) an antioxidant represented by the following formula. The sealing material contains 0.5 to 10 parts by mass of (D) the antioxidant based on a total of 100 parts by mass of (A) the epoxy resin and (B) the amine curing agent.

[Chemical formula 2]

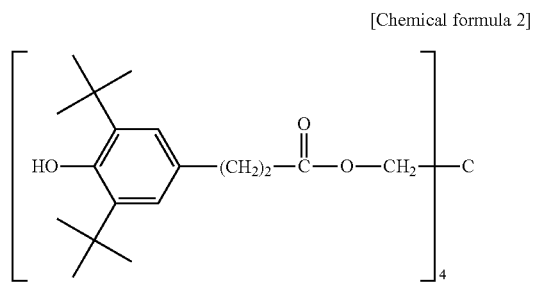

In the liquid epoxy resin sealing material of the present disclosure, (B) the amine curing agent preferably contains 3,5-diethyltoluene-2,4-diamine and 3,5-diethyltoluene-2,6-diamine.

In the liquid epoxy resin sealing material of the present disclosure, an addition amount of (C) the inorganic filler is preferably 55 to 70 parts by mass based on a total amount of the liquid epoxy resin sealing material. Further, an equivalent ratio of (A) the epoxy resin to (B) the amine curing agent is preferably 0.7 to 1.2.

Further, according to the present disclosure, there is provided the semiconductor device having a flip chip semiconductor element sealed using the liquid epoxy resin sealing material of the present disclosure.

Effects of the Invention

In the liquid epoxy resin sealing material of the present disclosure, the occurrence of the fillet crack due to the aerobic thermal degradation is suppressed.

In addition, the liquid epoxy resin sealing material of the present disclosure has good storage stability at room temperature.

DESCRIPTION OF THE EMBODIMENTS

The present disclosure will be described in detail below.
A liquid epoxy resin sealing material of the present disclosure contains components (A) to (D) shown below.

(A) Liquid Epoxy Resin

A liquid epoxy resin as the component (A) is a component which is a main material of the liquid epoxy resin sealing material of the present disclosure.

In the present disclosure, the liquid epoxy resin means an epoxy resin which is liquid at normal temperature.

Examples of liquid epoxy resins in the present disclosure include bisphenol A-type epoxy resins having an average molecular weight of about 400 or less, branched polyfunctional bisphenol A type epoxy resins such as p-glycidyloxyphenyldimethyl tris bisphenol A diglycidyl ether, bisphenol F type epoxy resins, phenol novolac type epoxy resins having an average molecular weight of about 570 or less, alicyclic epoxy resins such as vinyl(3,4-cyclohexene)dioxide, (3,4-epoxycyclohexyl)methyl 3,4-epoxycyclohexylcarboxylate, bis(3,4-epoxy-6-methylcyclohexylmethyl)adipate, and 2-(3,4-epoxycyclohexyl)5,1-spiro(3,4-epoxycyclohexyl)-m-dioxane, biphenyl type epoxy resins such as 3,3',5,5'-tetramethyl-4,4'-diglycidyloxybiphenyl, glycidyl ester type epoxy resins such as diglycidyl hexahydrophthalate, diglycidyl 3-methylhexahydrophthalate, and diglycidyl hexahydroterephthalate, glycidyl amine type epoxy resins such as diglycidyl aniline, diglycidyl toluidine, triglycidyl-p-aminophenol, tetraglycidyl-m-xylylenediamine, and tetraglycidyl bis(aminomethyl)cyclohexane, hydantoin type epoxy resins such as 1,3-diglycidyl-5-methyl-5-ethylhydantoin, and naphthalene ring-containing epoxy resins. Further, epoxy resins having a silicone skeleton such as 1,3-bis(3-glycidoxypropyl)-1,1,3,3-tetramethyldisiloxane can also be used. Other examples include diepoxide compounds such as (poly)ethylene glycol diglycidyl ether, (poly)propylene glycol diglycidyl ether, butanediol diglycidyl ether, neopentyl glycol diglycidyl ether, and cyclohexane dimethanol diglycidyl ether, and triepoxide compounds such as trimethylolpropane triglycidyl ether and glycerol triglycidyl ether.

Among these liquid epoxy resins, a liquid bisphenol type epoxy resin, a liquid aminophenol type epoxy resin, a silicone-modified epoxy resin, or a naphthalene type epoxy resin is preferably used. More preferably, a liquid bisphenol A type epoxy resin, a liquid bisphenol F type epoxy resin, a p-aminophenol type liquid epoxy resin, or 1,3-bis(3-glycidoxypropyl) tetramethyldisiloxane is used.

A single liquid epoxy resin can be used as the component (A). Or, two or more liquid epoxy resins may be used in combination.

Furthermore, an epoxy resin which is solid at normal temperature can also be used as long as the resin is used in combination with the liquid epoxy resin to form a liquid mixture.

(B) Amine Curing Agent

In the liquid epoxy resin sealing material of the present disclosure, an amine curing agent is used as a curing agent for the epoxy resin. The reason is that the amine curing agent is excellent in moisture resistance and thermal cycle resistance.

The amine curing agent is not particularly limited. The amine curing agent used can be selected from a wide range of known amine curing agents.

Specific examples of the amine curing agent include aliphatic polyamines such as triethylenetetramine, tetraethylenepentamine, m-xylenediamine, trimethylhexamethylenediamine, and 2-methylpentamethylenediamine, alicyclic polyamines such as isophoronediamine, 1,3-bisaminomethylcyclohexane, bis(4-aminocyclohexyl)methane, norbornene diamine, and 1,2-diaminocyclohexane, piperazine type polyamines such as N-aminoethyl piperazine, and 1,4-bis(2-amino-2-methylpropyl)piperazine, and diethyltoluenediamines such as 3,5-diethyltoluene-2,4-diamine, and 3,5-diethyltoluene-2,6-diamine, and aromatic polyamines such as dimethylthiotoluenediamine, 4,4'-diamino-3,3'-diethyldiphenylmethane, bis(methylthio)toluenediamine, diaminodiphenylmethane, m-phenylenediamine, diaminodiphenylsulfone, diethyltoluenediamine, trimethylene bis(4-aminobenzoate), and polytetramethylene oxide-di-p-aminobenzoate. Further, examples of commercially available products include T-12 (trade name, manufactured by Sanyo Chemical Industries, Ltd.) (amine equivalent: 116).

Among these amine curing agents, the amine curing agent containing 3,5-diethyltoluene-2,4-diamine or 3,5-diethyltoluene-2,6-diamine is preferred. With such an amine curing agent, a glass transition point (Tg) of the liquid resin sealing material added can be set high. Further, viscosity of the liquid resin sealing material can be reduced.

As the component (B), a single amine curing agent can be used. Or, two or more amine curing agents may be used in combination.

In the liquid epoxy resin sealing material of the present disclosure, a blending ratio of the amine curing agent as the component (B) is not particularly limited. For example, the blending ratio is preferably 0.7 to 1.2 equivalents, more preferably 0.7 to 1.1 equivalents based on 1 equivalent of epoxy group of the epoxy resin as the component (A).

(C) Inorganic Filler

An inorganic filler as the component (C) is added to the liquid epoxy resin sealing material for the purpose of improving the moisture resistance and the thermal cycle resistance, particularly the thermal cycle resistance, of a sealed portion. The thermal cycle resistance is improved by adding the inorganic filler. This is because expansion or contraction of cured product of the liquid epoxy resin sealing material due to a thermal cycle can be suppressed by reducing a linear expansion coefficient.

The inorganic filler as the component (C) is not particularly limited as long as it has an effect of reducing the linear expansion coefficient by addition. Various inorganic fillers can be used. Specific examples include amorphous silica, crystalline silica, alumina, boron nitride, aluminum nitride, and silicon nitride.

Among these, silica, in particular, amorphous spherical silica is desirable. These silicas can provide excellent fluidity when the liquid epoxy resin sealing material of the present disclosure is used as an underfill. Further, the linear expansion coefficient of the cured product can be reduced.

The silica referred to here may be a silica having an organic group, for example, an alkyl group such as a methyl group or an ethyl group, derived from raw materials for production.

The amorphous spherical silica can be obtained by a known production method such as a melting method, a combustion method, or a sol-gel method. The production method can be appropriately selected based on properties such as a desired particle size, impurity content, and surface conditions.

Further, as the silica used as the inorganic filler, a silica-containing composition obtained by the production method described in JP-A-2007-197655 may be used.

Further, the inorganic filler may be surface-treated with a silane coupling agent or the like. In the case of using the surface-treated inorganic filler, an effect of preventing aggregation of the inorganic filler is expected. This is expected to improve storage stability of the liquid epoxy resin sealing material of the present disclosure.

An average particle size of the inorganic filler as the component (C) is preferably 0.1 to 10 μm, and more preferably 0.2 to 2 μm.

Here, a shape of the inorganic filler is not particularly limited. For example, the inorganic filler of any of spherical, amorphous, and scaly forms can be used. Note that, except when the shape of the inorganic filler is spherical, the average particle size of the inorganic filler means an average maximum diameter of the inorganic filler.

The content of the inorganic filler as the component (C) is preferably 55 to 70 parts by mass based on a total amount of the epoxy resin sealing material, that is, based on 100 parts by mass in total of all the components. With the content of 55 to 70 parts by mass, when the liquid epoxy resin sealing material is used as the underfill, the linear expansion coefficient of the liquid epoxy resin sealing material can be reduced, and deterioration of injection properties can be avoided. The content is more preferably 60 to 70 parts by mass.

(D) Antioxidant Represented by the Following Formula

[Chemical formula 3]

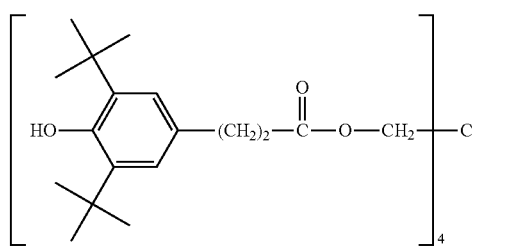

As described above, in aerobic thermal degradation reaction, a radical chain reaction proceeds. A reactive peroxy radical ROO. is generated from a radical R. generated in an initial stage of the reaction. A hindered phenolic antioxidant has an action of scavenging the peroxy radical and converting it to metastable hydroperoxide ROOH.

The present inventors have found that addition of the antioxidant represented by the above formula among hindered phenolic antioxidants more effectively suppresses occurrence of fillet cracks due to aerobic thermal degradation. This excellent effect of suppressing the occurrence of the fillet cracks is confirmed in comparison with a liquid epoxy resin composition containing a hindered phenolic antioxidant having another structure in Examples and the like described below.

The reason why the occurrence of the fillet cracks due to the aerobic thermal degradation are suppressed by addition of the antioxidant represented by the above formula is not clear. However, the following mechanism can be presumed as the reason.

In the antioxidant represented by the above formula, four hindered phenol groups are bonded to one carbon atom. Therefore, it is presumed that the action of scavenging the peroxy radical and converting it to the metastable hydroperoxide ROOH is highly effective. As a result, an effect of suppressing progress of the aerobic thermal degradation is high. Thus, it is presumed that the occurrence of the fillet cracks can be suppressed.

The liquid epoxy resin sealing material of the present disclosure contains 0.5 to 10 parts by mass of (D) an antioxidant based on 100 parts by mass of a total of (A) an epoxy resin and (B) an amine curing agent.

When an amount of (D) the antioxidant is less than 0.5 parts by mass, the amount is insufficient to suppress the occurrence of the fillet cracks due to the aerobic thermal degradation. When (D) the antioxidant is more than 10 parts by mass, since the storage stability at normal temperature is lowered, pot life is shortened.

The content of (D) the antioxidant is preferably 0.5 to 5 parts by mass.

(Other Compounding Agents)

The liquid epoxy resin sealing material of the present disclosure may further contain components other than the components (A) to (D) as required.

Specific examples of such components which can be incorporated include coupling agents, leveling agents, curing accelerators, surface modifiers, antifoaming agents, ion trapping agents, elastomers, and colorants such as carbon. Types and blending amounts of compounding agents are as usual.

(Preparation of Liquid Epoxy Resin Sealing Material)

In preparation of the liquid epoxy resin sealing material of the present disclosure, the components (A) to (D) and other compounding agents optionally blended are mixed. Next, the resulting mixture is stirred to prepare the liquid epoxy resin sealing material. A roll mill can be used for mixing and stirring. Of course, means for mixing and stirring is not limited to the roll mill. When the epoxy resin of the component (A) is solid, the epoxy resin liquefied or fluidized by heating or the like is preferably mixed.

The components can be mixed simultaneously. However, changes may be made such as mixing some of the components first and mixing the remaining components later.

Next, characteristics of the liquid epoxy resin sealing material of the present disclosure will be described.

In the liquid epoxy resin sealing material of the present disclosure, the occurrence of the fillet cracks due to the aerobic thermal degradation are suppressed. The number of cracks generated at the time of high temperature storage test measured by a procedure described below is preferably 20 or less, and more preferably 15 or less.

The liquid epoxy resin sealing material of the present disclosure has good storage stability at room temperature. Therefore, the liquid epoxy resin sealing material has an excellent pot life. Thickening rate measured by a procedure described in Examples described below is preferably less than 2 times, and more preferably 1.8 times or less.

Due to these properties, the liquid epoxy resin sealing material of the present disclosure is suitably used as the underfill. The liquid epoxy resin sealing material of the present disclosure can be used for both a capillary type underfill (hereinafter referred to as a "capillary underfill") and a pre-applied underfill.

Moreover, the liquid epoxy resin sealing material of the present disclosure can also be used as an adhesive used at the time of manufacturing a semiconductor device.

Next, usage of the liquid epoxy resin sealing material of the present disclosure will be described, by way of example, with reference to its use as the capillary underfill.

When the liquid epoxy resin sealing material of the present disclosure is used as the capillary underfill, a gap between a substrate and a semiconductor element is filled with the liquid epoxy resin sealing material of the present disclosure by the following procedure.

While the substrate is heated to, for example, 70 to 130° C., the liquid epoxy resin sealing material of the present disclosure is applied to one end of the semiconductor element. Then, the gap between the substrate and the semiconductor element is filled with the liquid epoxy resin sealing material of the present disclosure by capillary action. At this time, the substrate may be tilted in order to reduce a time required to fill the liquid epoxy resin sealing material of the present disclosure. Or, a pressure difference may be generated inside and outside the gap.

After the gap is filled with the liquid epoxy resin sealing material of the present disclosure, the substrate is heated at a predetermined temperature for a predetermined time, specifically at 80 to 200° C. for 0.2 to 6 hours, so that the liquid epoxy resin sealing material is heat-cured to seal the gap.

In the semiconductor device of the present disclosure, by using the liquid epoxy resin sealing material of the present disclosure as the underfill, a sealing portion, that is, the gap between the substrate and the semiconductor element is sealed by the above procedure. The semiconductor element to be sealed here is not particularly limited. Examples include "integrated circuits, large scale integrated circuits, transistors, thyristors, diodes and capacitors".

EXAMPLES

Hereinafter, the present disclosure will be described in detail by way of Examples. However, the present disclosure is not limited thereto.

Examples 1 to 12, Comparative Examples 1 to 4

The raw materials blended at blending ratios shown in the following table were kneaded with the roll mill. Thus, the liquid epoxy resin sealing materials of Examples 1 to 12 and Comparative Examples 1 to 4 were prepared. Note that numerical values regarding each composition in the table represent parts by mass.

(A) Liquid Epoxy Resin

Epoxy resin A-1: Bisphenol F type liquid epoxy resin, product name YDF8170, manufactured by Nippon Steel Chemical Co., Ltd., epoxy equivalent weight 158 g/eq Epoxy resin A-2: Aminophenol type liquid epoxy resin, product name jER630D, manufactured by Mitsubishi Chemical Corporation, epoxy equivalent 94 g/eq (B) Amine Curing Agent Amine curing agent B-1: 3,5-diethyltoluene-2,4-diamine and 3,5-diethyltoluene-2,6-diamine are contained, product name ETHACURE 100, manufactured by ALBEMARLE Co., Ltd.

Amine curing agent B-2: 4,4'-diamino-3,3'-diethyldiphenylmethane, product name KAYAHARD A-A (HDAA), manufactured by Nippon Kayaku Co., Ltd.

Amine curing agent B-3: Dimethylthiotoluenediamine (including modified aromatic amine), product name EH105L, manufactured by ADEKA Co., Ltd.

(C) Inorganic Filler

Inorganic filler C-1: Silane coupling agent (3-glycidoxypropyltrimethoxysilane) surface-treated silica filler (average particle size 0.5 μm), product name SE2200-SEE, manufactured by Admatechs Co., Ltd.

Inorganic filler C-2: Silica coupling agent (3-glycidoxypropyltrimethoxysilane) surface-treated silica filler (average particle size 1.5 μm), product name SE5200-SEE, manufactured by Admatechs Co., Ltd.

(D) Antioxidant

Antioxidant D-1: Hindered Phenolic Antioxidant, Product Name IRGANOX1010

(Following Formula), Manufactured by BASF

[Chemical formula 4]

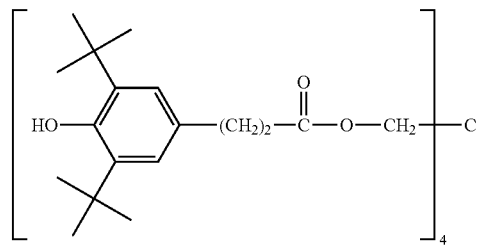

Antioxidant D-2: Hindered Phenolic Antioxidant, Product Name IRGANOX1035

(Following Formula), Manufactured by BASF

[Chemical formula 5]

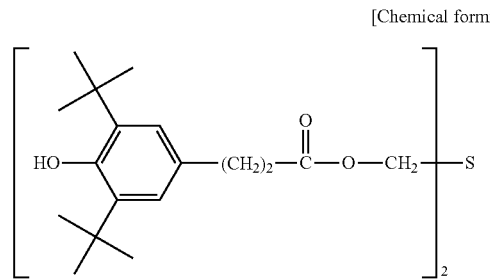

Antioxidant D-3: Hindered Phenolic Antioxidant, Product Name IRGANOX1076

(Following Formula), Manufactured by BASF

[Chemical formula 6]

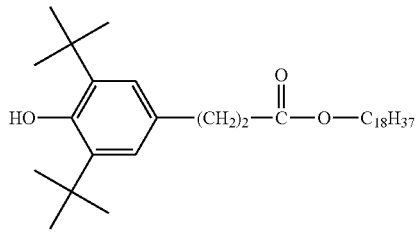

(Initial Viscosity, Thickening Rate after One Day Storage)

The viscosity (Pa·s) at 25° C. of the liquid epoxy resin sealing material prepared by the above procedure was measured at 50 rpm using a rotational viscometer HBDV-1 (with spindle SC4-14) available from Brookfield. A measured value obtained was defined as an initial viscosity. Next, the thickening rate (thickening rate after one day storage), which is an index of the pot life of the resin composition, was determined by the following procedure. First, the prepared resin composition was stored for one day in an environment of 25° C. and 50% humidity in a closed container. The viscosity of the resin composition at this point was measured by the same procedure. A ratio of the obtained viscosity to the viscosity immediately after preparation was calculated. The calculated ratio was defined as the thickening rate.

(High Temperature Storage Test)

A test element group (TEG) with PI passivation die (die size 10 mm×10 mm×0.725 mm thickness), Sn/3Ag/0.5Cu bumps (bump pitch 150 μm, the number of bumps 3721) was used. Here, the PI passivation die is formed on a high heat resistant (High-Tg) FR-4 substrate (substrate size 30 mm×30 mm×0.8 mm thickness) coated with solder resist (PSR-4000 AUS 703). The liquid epoxy resin sealing material obtained by the above procedure was injected into a die portion of the TEG. The liquid epoxy resin sealing material was cured by heating at 150° C. for 120 minutes. The TEG was left for 1000 hours in a drier maintained at 190° C. under the atmosphere. Thereafter, the number of cracks generated in fillets was counted.

TABLE 1

| | Comparative Example 1 | Example 1 | Example 2 | Example 3 | Example 4 | Example 5 | Comparative Example 2 |
|---|---|---|---|---|---|---|---|
| Epoxy resin A-1 | 13.1 | 13.0 | 12.9 | 12.8 | 12.4 | 11.8 | 11.6 |
| Epoxy resin A-2 | 13.1 | 13.0 | 12.9 | 12.8 | 12.4 | 11.8 | 11.6 |
| Amine curing agent B-1 | 8.9 | 8.9 | 8.8 | 8.7 | 8.5 | 8.0 | 7.9 |
| Amine curing agent B-2 | | | | | | | |
| Amine curing agent B-3 | | | | | | | |
| Inorganic filler C-1 | 65.0 | 65.0 | 65.0 | 65.0 | 65.0 | 65.0 | 65.0 |
| Inorganic filler C-2 | | | | | | | |
| Antioxidant D-1 | | 0.18 | 0.35 | 0.70 | 1.75 | 3.50 | 3.85 |
| Antioxidant D-2 | | | | | | | |
| Antioxidant D-3 | | | | | | | |
| Total | 100 | 100 | 100 | 100 | 100 | 100 | 100 |
| Parts by mass of component D based on 100 parts by mass of resin component | | 0.5 | 1.0 | 2.0 | 5.0 | 10.0 | 11.0 |
| Curing agent equivalent/Epoxy equivalent | 0.9 | 0.9 | 0.9 | 0.9 | 0.9 | 0.9 | 0.9 |
| Viscosity [Pa·s] Initial | 16.0 | 18.8 | 23.6 | 19.6 | 28.6 | 66.8 | 84.8 |
| Viscosity [Pa·s] After one day | 20.0 | 24.0 | 30.2 | 24.8 | 39.8 | 118.4 | 166.2 |
| Thickening rate after one day storage | 1.3 | 1.3 | 1.3 | 1.3 | 1.4 | 1.8 | 2.0 |
| The number of cracks generated (pieces) | 29 | 12 | 6 | 4 | 2 | 1 | 1 |

TABLE 2

| | Example 6 | Example 7 | Example 8 | Example 9 | Comparative Example 3 | Comparative Example 4 | Example 10 | Example 11 | Example 12 |
|---|---|---|---|---|---|---|---|---|---|
| Epoxy resin A-1 | 13.6 | 11.8 | 16.5 | 11.0 | 12.8 | 12.8 | 11.9 | 11.9 | 12.4 |
| Epoxy resin A-2 | 13.6 | 11.8 | 16.5 | 11.0 | 12.8 | 12.8 | 11.9 | 11.9 | 12.4 |
| Amine curing agent B-1 | 7.2 | 10.7 | 11.2 | 7.5 | 8.8 | 8.8 | 4.8 | | 8.5 |
| Amine curing agent B-2 | | | | | | | 4.8 | 4.7 | |
| Amine curing agent B-3 | | | | | | | | 4.7 | |
| Inorganic filler C-1 | 65.0 | 65.0 | 55.0 | 70.0 | 65.0 | 65.0 | 65.0 | 65.0 | |
| Inorganic filler C-2 | | | | | | | | | 65.0 |
| Antioxidant D-1 | 0.70 | 0.70 | 0.90 | 0.60 | | | 1.75 | 1.75 | 1.75 |
| Antioxidant D-2 | | | | | 0.70 | | | | |
| Antioxidant D-3 | | | | | | 0.70 | | | |
| Total | 100 | 100 | 100 | 100 | 100 | 100 | 100 | 100 | 100 |
| Parts by mass of component D based on 100 parts by mass of resin component | 2.0 | 2.0 | 2.0 | 2.0 | 2.0 | 2.0 | 5.0 | 5.0 | 5.0 |
| Curing agent equivalent/Epoxy equivalent | 0.7 | 1.2 | 0.9 | 0.9 | 0.9 | 0.9 | 0.9 | 0.9 | 0.9 |
| Viscosity Initial [Pa · s] | 23.6 | 18.6 | 7.9 | 189.0 | 21.4 | 30.4 | 30.4 | 27.2 | 12.0 |
| After one day | 29.6 | 25.2 | 9.4 | 198.4 | 27.4 | 37.0 | 41.8 | 33.8 | 14.8 |
| Thickening rate after one day storage | 1.3 | 1.4 | 1.2 | 1.0 | 1.3 | 1.2 | 1.4 | 1.2 | 1.2 |
| The number of cracks generated (pieces) | 2 | 3 | 13 | 7 | 42 | 48 | 5 | 3 | 4 |

The number of cracks generated after the high temperature storage test of the liquid epoxy resin sealing materials of Examples 1 to 12 was 20 or less. The occurrence of the fillet cracks due to the aerobic thermal degradation was suppressed. Further, after one day storage, the thickening rate was less than 2.0 times. The storage stability at room temperature was good. In Examples 2 to 5, the blending ratio of the antioxidant D-1 in Example 1 is changed. When the blending ratio of the antioxidant D-1 is increased, the number of cracks generated after the high temperature storage test decreases. However, the thickening rate was increased after one day storage. In Comparative Example 1 in which the antioxidant D-1 was not blended, the number of cracks generated after the high temperature storage test was as high as 29. On the other hand, in Comparative Example 2 in which the antioxidant D-1 was blended in excess of 10 parts by mass, the thickening rate after one day storage was as high as 2.0.

In Comparative Examples 3 and 4 in which the hindered phenolic antioxidants D-2 and D-3 having a structure different from the antioxidant D-1 are used, the number of cracks generated after the high temperature storage test was higher than in Comparative Example 1 in which the antioxidant D-1 is not blended. It is presumed that the effect of suppressing the occurrence of the fillet cracks due to the aerobic thermal degradation is low. In addition to this, it is presumed that thermal decomposition products of the antioxidants D-2 and D-3 generated during the high temperature storage test have adversely affected the liquid epoxy resin sealing material.

In Examples 6 and 7, the epoxy equivalent of the amine curing agent B-1 of Example 3 is changed. Effects of change in the epoxy equivalent of the amine curing agent B-1 on the number of cracks generated after the high temperature storage test and the thickening rate after one day storage were not observed.

In Examples 8 and 9, the blending ratio of the inorganic filler C-1 in Example 3 is changed. In Example 8, the blending ratio of the inorganic filler C-1 is lower than that of Example 1. In Example 8, the number of cracks generated after the high temperature storage test was increased. This is presumed to be due to shrinkage of the cured resin when left at high temperature.

In Examples 10 and 11, the type of amine curing agent of Example 4 is changed. That is, while the amine curing agent B-1 is used in Example 4, the amine curing agents B-1 and B-2 are used in combination in Example 10. Similarly, in Example 11, the amine curing agents B-2 and B-3 are used in combination. Effects of difference in the amine curing agents on the number of cracks generated after the high temperature storage test and the thickening rate after one day storage were not observed.

In Example 12, the average particle size of the inorganic filler of Example 4 is changed. Specifically, while the silica filler (inorganic filler C-1) having an average particle diameter of 0.5 μm is used in Example 4, the silica filler (inorganic filler C-2) having an average particle diameter of 1.5 μm is used in Example 12. Effects of difference in the average particle diameter of the inorganic filler on the number of cracks generated after the high temperature storage test and the thickening rate after one day storage were not observed.

The invention claimed is:

1. A liquid epoxy resin sealing material comprising (A) a liquid epoxy resin at normal temperature, (B) an amine curing agent, (C) an inorganic filler, and (D) an antioxidant represented by the following formula, wherein 0.5 to 10 parts by mass of (D) the antioxidant agent is contained based on a total of 100 parts by mass of (A) the liquid epoxy resin at normal temperature, (B) the amine curing agent and (D) the antioxidant agent

[Chemical formula 1]

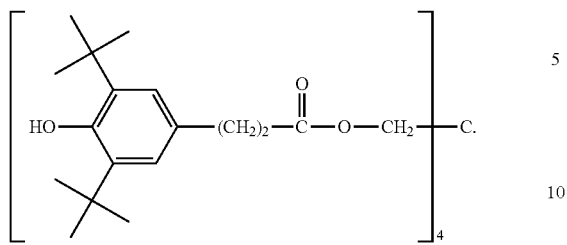

2. The liquid epoxy resin sealing material according to claim 1, wherein (B) the amine curing agent comprises 3,5-diethyltoluene-2,4-diamine and 3,5-diethyltoluene-2,6-diamine.

3. The liquid epoxy resin sealing material according to claim 1, wherein an additional amount of (C) the inorganic filler is 55 to 70 parts by mass based on a total amount of the liquid epoxy resin sealing material.

4. The liquid epoxy resin sealing material according to claim 1, wherein an equivalent ration of (A) the liquid epoxy resin at normal temperature to (B) the amine curing agent is 0.7 to 1.2.

5. A semiconductor device having a flip chip semiconductor element sealed using the liquid epoxy resin sealing material according to claim 1.

* * * * *